United States Patent
Huang et al.

(10) Patent No.: US 6,663,785 B1
(45) Date of Patent: Dec. 16, 2003

(54) BROAD SPECTRUM EMITTER ARRAY AND METHODS FOR FABRICATION THEREOF

(75) Inventors: Zhe Huang, Fremont, CA (US); Mark A. Devito, Vancouver, WA (US); Mike P. Grimshaw, Vancouver, WA (US); Paul A. Crump, Portland, OR (US); Jason N. Farmer, Seattle, WA (US); Mark R. Pratt, Seattle, WA (US)

(73) Assignee: nLight Photonics Corporation, Seattle, WA (US)

( * ) Notice: Subject to any disclaimer, the term of this patent is extended or adjusted under 35 U.S.C. 154(b) by 104 days.

(21) Appl. No.: 10/092,018

(22) Filed: Mar. 6, 2002

Related U.S. Application Data

(60) Provisional application No. 60/316,829, filed on Aug. 31, 2001.

(51) Int. Cl.[7] .............................. B44C 1/22; H01L 21/00
(52) U.S. Cl. .............................. 216/2; 216/24; 372/23; 372/46; 372/50; 372/69; 438/689
(58) Field of Search ............................... 216/2, 24, 65; 372/23, 45, 46, 50, 69, 70, 75; 438/34, 689, 706, 707

(56) References Cited

U.S. PATENT DOCUMENTS

| | | |
|---|---|---|
| 4,923,270 A | 5/1990 | Carter |
| 5,048,040 A | 9/1991 | Paoli |
| 5,068,868 A | 11/1991 | Deppe et al. |
| 5,163,058 A | 11/1992 | Farries et al. |
| 5,214,664 A | 5/1993 | Paoli |
| 5,319,668 A | 6/1994 | Luecke |
| 5,386,426 A | 1/1995 | Stephens |
| 5,708,674 A | 1/1998 | Beernink et al. |
| 5,764,676 A | 6/1998 | Paoli et al. |
| 5,963,568 A | 10/1999 | Paoli |
| 6,052,394 A | 4/2000 | Lee et al. |
| 6,172,997 B1 | 1/2001 | Miyake et al. |
| 6,192,062 B1 | 2/2001 | Sanchez-Rubio et al. |
| 6,208,679 B1 | 3/2001 | Sanchez-Rubio et al. |

OTHER PUBLICATIONS

"Multiple–Wavelength Diode Laser SuperArray", by J. Epler, D. W. Treat, S. E. Nelson, and T. Paoli. IEEE, vol. QE–26, No. 4, Apr. 1990, p. 663–668.

"Extremely Broadband Tunable Semiconductor Lasers for Optical Communication", by Ching–Fuh Lin, Yi–Shin Su, and Bing–Ruey Wu. CLEO 2001 CTuV2, 5:45p.m., p. 237–238.

*Primary Examiner*—William A. Powell
(74) *Attorney, Agent, or Firm*—Fulbright & Jaworski L.L.P.

(57) ABSTRACT

Embodiments of the present invention are directed to method of fabrication of a broadband emitter array. Embodiments of the present invention may grown a first set of emitters possessing a first quantum well characteristic (e.g., quantum well thickness or composition). A portion of the first set of emitters is removed by etching. In place of the removed emitters, a second set of emitters is regrown with said second set of emitters possessing a different quantum well characteristic. By fabricating the emitters sets in this manner, a unitary emitter array may be fabricated that possesses an increased bandwidth, e.g., the first and second sets of emitters may be associated with different center wavelengths. Embodiments of the present invention may utilize emitter arrays fabricated in this manner in, for example, incoherently beam combined (IBC) lasers and in Raman amplifier systems.

27 Claims, 3 Drawing Sheets

BROAD SPECTRUM EMITTER ARRAY AND METHODS FOR FABRICATION THEREOF

CROSS-REFERENCE TO RELATED APPLICATIONS

The present application claims the benefit of and priority to U.S. Patent Provisional Application Serial No. 60/316,829 filed Aug. 31, 2001, entitled "BROAD SPECTRUM RAMAN PUMP LASER," the disclosure of which is hereby incorporated herein by reference.

The present application is related to commonly assigned and co-pending U.S. patent application Ser. No. 09/945,324, entitled "SYSTEM AND METHOD FOR PROVIDING A CONTROLLED LINEWIDTH EXTERNAL CAVITY LASER," and U.S. patent application Ser. No. 09/929,837, entitled "SYSTEM AND METHOD FOR OPTIMIZING THE PERFORMANCE OF A MULTIPLE GAIN ELEMENT LASER," the disclosures of which are hereby incorporated herein by reference.

TECHNICAL FIELD

This invention relates in general to lasers, and in specific to methods for fabricating a broad spectrum emitter array and systems for using a broad spectrum emitter array.

BACKGROUND OF THE INVENTION

Known incoherently beam combined (IBC) lasers combine the output from an array of gain elements or emitters (typically consisting of semiconductor material, such as GaAlAs, GaAs, InGaAs, InGaAsP, AlGaInAs, and/or the like, which is capable of lasing at particular wavelengths) into a single output beam that may be coupled into, for example, an optical fiber. The gain elements may be discrete devices or may be included on an integrated device. Due to the geometry of IBC lasers, each gain element tends to lase at a unique wavelength. Exemplary arrangements of IBC lasers are described in U.S. patent application Ser. No. 6,052,394 and U.S. patent application Ser. No. 6,192,062.

FIG. 1 depicts a prior art arrangement of components in IBC laser 10. IBC laser includes emitters 12-1 through 12-N associated with fully reflective surface 11. The optical power emitted by emitters 12-1 through 12-N is generated in their quantum wells (not shown) which are surrounded by waveguide layers (not shown) and cladding layers (not shown). The cladding layers confine the light produced by the laser in the waveguide layers and the gain region in a single mode. Semiconductor lasers that use quantum wells offer dramatically lower threshold current densities compared to bulk heterostructures and are therefore advantageous due to their higher efficiency.

In known IBC laser devices, each emitter is exactly the same, i.e., emitters 12-1 through 12-N are grown via a single fabrication process and, hence, possess identical characteristics. Moreover, each emitter in known IBC laser technology only possesses identical quantum wells in the active region of the respective emitter. Accordingly, the intrinsic bandwidth of each emitter is limited to the bandwidth of the identical quantum wells defined by the selected fabrication process.

Emitters 12-1 through 12-N are disposed in a substantially linear configuration that is perpendicular to the optical axis of collimator 15 (e.g., a lens). Collimator 15 causes the plurality of beams produced by emitters 12-1 through 12-N to be substantially collimated and spatially overlapped on a single spot on diffraction grating 16. Additionally, collimator 15 directs feedback from partially reflective 17 via diffraction grating 16 to emitters 12-1 through 12-N.

Diffraction grating 16 is disposed from collimator 15 at a distance approximately equal to the focal length of collimator 15. Furthermore, diffraction grating 16 is oriented to cause the output beams from emitters 12-1 through 12-N to be diffracted on the first order toward partially reflective component 17, thereby multiplexing the output beams. Partially reflective component 17 causes a portion of optical energy to be reflected. The reflected optical energy is redirected by diffraction grating 16 and collimator 15 to the respective emitters 12-1 through 12-N. Diffraction grating 16 angularly separates the reflected optical beams causing the same wavelengths generated by each emitter 12-1 through 12-N to return to each respective emitter 12-1 through 12-N. Accordingly, diffraction grating 16 is operable to demultiplex the reflected beams from reflective component 17.

It shall be appreciated that the geometry of external cavity 13 of IBC laser 10 defines the resonant wavelengths of emitters 12-1 through 12-N. The center wavelength ($\lambda_i$) of the wavelengths fed back to the $i^{th}$ emitter 12-i is given by the following equation: $\lambda_i = A[\sin(\alpha_i) + \sin(\beta)]$. In this equation, A is the spacing between rulings on diffraction grating 16, $\alpha_i$ is the angle of incidence of the light from the $i^{th}$ emitter on diffraction grating 16, and $\beta$ is the output angle which is common to all emitters 12-1 through 12-N. The overall bandwidth of IBC laser 10 is $\lambda_1 - \lambda_N$, or $\Delta\lambda_{laser}$. As further examples, similar types of laser configurations are also discussed in U.S. patent application Ser. No. 6,208,679.

As previously discussed, in known IBC laser technology, each laser diode is the same as the others, and each quantum well in a particular device is the same as the other quantum wells of the device. The quantum wells provide a peak gain at a particular wavelength, $\lambda_C$, or center wavelength, and have a bandwidth of $\Delta\lambda_{QW}$. The quantum well bandwidth is the range of wavelengths over which the quantum wells can provide a gain. Thus, the laser array is constrained by the bandwidth of the quantum wells, such that the bandwidth of the laser array, $\Delta\lambda_{laser}$, must be less than the bandwidth of the quantum wells, $\Delta\lambda_{QW}$.

Additionally, Raman amplifiers have been developed to amplify optical signals. A Raman amplifier relies upon the Raman scattering effect. The Raman scattering effect is a process in which light is frequency downshifted in a material. The frequency downshift results from a nonlinear interaction between light and the material. The difference in frequency between the input light and the frequency downshifted light is referred to as the Stokes shift which in silica fibers is of the order 13 THz.

When photons of two different wavelengths are present in an optical fiber, Raman scattering effect can be stimulated. This process is referred to as stimulated Raman scattering (SRS). In the SRS process, longer wavelength photons stimulate shorter wavelength photons to experience a Raman scattering event. The shorter wavelength photons are destroyed and longer wavelength photons, identical to the longer wavelength photons present initially, are created. The excess energy is released as an optical phonon (a lattice vibration). This process results in an increase in the number of longer wavelength photons and is referred to as Raman gain.

As is well understood in the art, SRS is useful for generating optical gain. Optical amplifiers based on Raman gain are viewed as promising technology for amplification of WDM and DWDM telecommunication signals transmitted on optical fibers. Until recently, Raman amplifiers have not attracted much commercial interest because significant optical gain requires approximately one watt of optical pump power. Lasers capable of producing these powers at the wavelengths appropriate for Raman amplifiers have only come into existence over the past few years. These advances have renewed interest in Raman amplifiers.

Single cavity IBC lasers have typically been considered inappropriate to stimulate Raman gain for many telecommunication networks, because known IBC laser technology suffers from limited bandwidth. Specifically, Raman amplifiers based on IBC laser technology will operate over a bandwidth that is limited by the intrinsic gain bandwidth (as defined by the quantum well characteristics) of the semiconductor material from which the device is made. The intrinsic gain bandwidth is due to the limitations of the emitters used in the known IBC laser designs. Known amplifiers used in telecommunication networks typically have bandwidths of about 40 nanometers (nm) at the wavelengths of interest, namely the C (1530 to 1565 nm) or L (1570 to 1610 nm) bands. However, known IBC technology cannot generate gain over the entire wavelength range. In particular, known IBC laser technology is not sufficient for the current systems operating at both the C and L bands, and is unsatisfactory for future systems operating at the S (1430 to 1530 nm), C, L, and XL (1615 to 1660 nm) telecommunication bands.

BRIEF SUMMARY OF THE INVENTION

The present invention is directed to systems and methods for generating Raman gain utilizing an IBC laser that possesses heterogeneous emitter structures. Specifically, an emitter array may be fabricated according to embodiments of the present invention such that the quantum well characteristics of respective emitter elements in the emitter array are tailored to permit efficient operation over different spectra. For example, in an embodiment of the present invention, emitters in an emitter array may be divided into two groups. Each emitter within the first group is substantially identical. Similarly, each emitter in the second group is substantially identical. The emitters in the first group are preferably implemented to possess a given bandwidth and a first center wavelength. The emitters in the second group are preferably implemented to possess a given bandwidth and a second center wavelength. The second center wavelength may be shorter than the first center wavelength. Accordingly, the emitter array may be oriented in an IBC laser such that the second group of emitters receives feedback that is associated with the blue portion of the feedback spectrum. Likewise, the emitter array may be oriented such that the first group of emitters receives feedback that is associated with the red portion of the feedback spectrum. By doing so, the intrinsic bandwidth of the IBC laser is increased and, hence, the IBC laser may generate Raman gain over a greater bandwidth that is suitable for typical telecommunication systems.

Embodiments of the present invention are directed toward fabrication methods for creating a suitable emitter array for an IBC laser that is used as a Raman pump. A suitable emitter array may be fabricated by growing the emitters on a single substrate. In the first stage of the fabrication process, the various layers (e.g. the confinement structure, the quantum well, the gain region, and/or the like) of the emitter array are grown on the substrate. The growth of the various layers may occur utilizing techniques that are known in the art. Additionally, in the first stage, the characteristics (e.g., quantum well composition and width) of the emitter of the emitters array are selected such that the emitters are designed to operate over a bandwidth centered at a first center wavelength. In a second stage of fabrication, a portion of the array is removed by, for example, suitable etching techniques. In a third stage of fabrication, a second set of emitters are regrown on the portion of the substrate where the other emitters were removed. The characteristics (e.g., quantum well composition and width) of the second set of emitters are selected such that the emitters are designed to operate over a bandwidth centered at a second center wavelength. Therefore, the emitter array (consisting of the two sets of emitters) may possess an appreciably increased intrinsic bandwidth by appropriately selecting the first and second center wavelengths.

Thus, embodiments of the invention increase the bandwidth of the laser array beyond $\Delta\lambda_{QW}$. By selecting different materials and/or a different thickness for the respective emitter groups of an emitter array, the laser array bandwidth, $\Delta\lambda_{laser}$, can be increased to $\Delta\lambda_{QW} + \lambda_{Cmax} - \lambda_{Cmin}$, where $\lambda_{Cmax}$ is the maximum center wavelength of the emitter groups and $\lambda_{Cmin}$ is the minimum center wavelength for emitter groups.

Also, it shall be appreciated that embodiments of the present invention tend to provide similar output power from each emitter element in the array. Since embodiments of the present invention have multiple center wavelengths, which are dispersed across the bandwidth, embodiments of the present invention tend to provide power more evenly across the bandwidth.

It shall be appreciated that the present invention is not limited to any particular number of emitter groups in an emitter array. Embodiments of the present invention may grown, etch, and regrow any suitable number of emitter groups in an emitter array depending upon their intended use in a suitable application.

In alternative embodiments of the present invention, the emitters (of an array fabricated using the preceding technique) may be modified to individually possess greater bandwidth. In embodiments of the present invention, the emitters may possess multiple quantum wells. In other embodiments of the present invention, the quantum well thickness of the emitters may vary in a direction that is parallel with the emerging light, e.g. from front to back. By utilizing either of these techniques, the bandwidth of the individual emitters (and, hence, the emitter array also) may be augmented.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
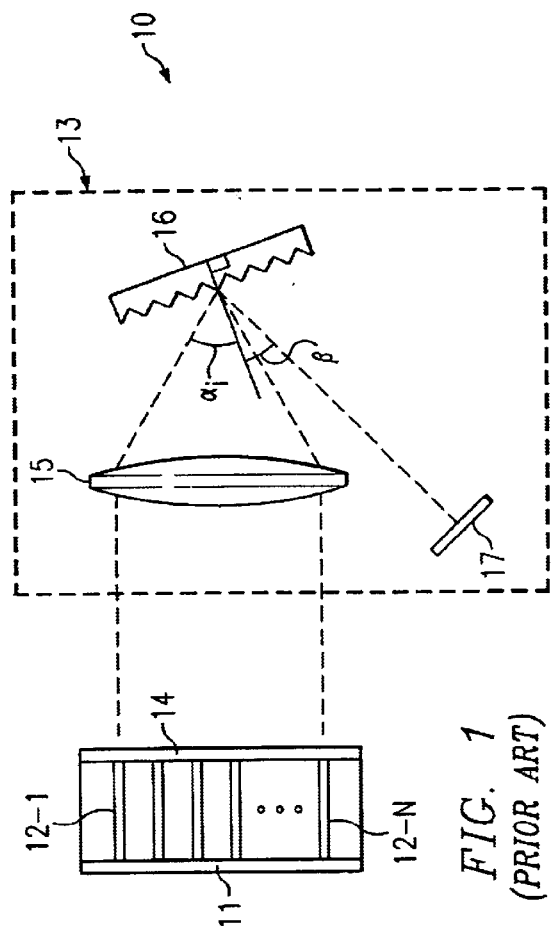
FIG. 1 depicts an incoherently beam combined (IBC) laser according to the prior art.
Figure 2:
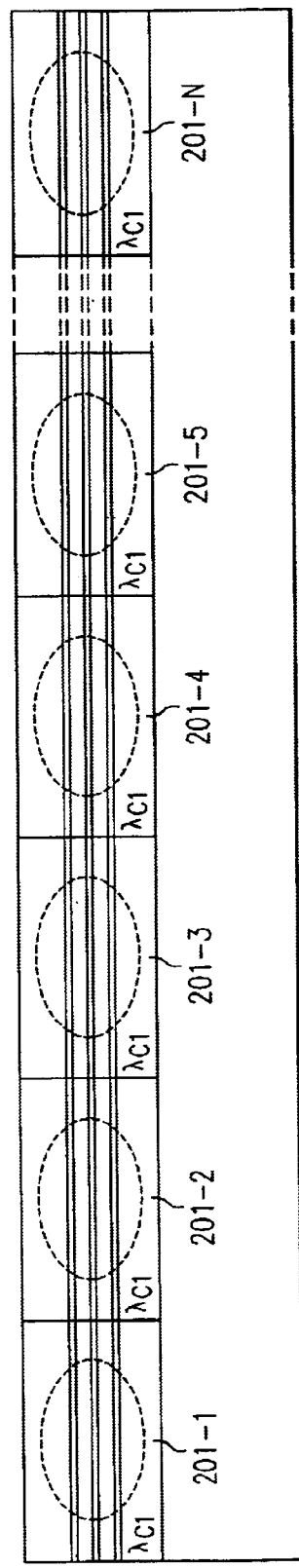
FIG. 2 depicts an emitter array fabricated on a substrate in a first fabrication stage according to embodiments of the present invention.

Embodiments of the present invention are directed toward fabrication techniques for creating a suitable emitter array to be used in an IBC laser that operates as a Raman pump. FIG. 2 depicts an exemplary emitter array consisting of emitters 201-1 through 201-N. Each of emitters 201-1 through 201-N may be grown on substrate 200 utilizing known emitter fabrication techniques. Substrate 200 may be an initial silicon layer. Alternatively, substrate 200 may be a layer grown or deposited over other layers including the initial silicon layer. Each respective layer (e.g. the confinement structure, the quantum well, the gain region, and/or the like) of the emitter array may be grown on substrate 200 utilizing appropriate masking, deposition, and etching operations. As each of emitters 201-1 through 201-N are preferably fabricated via a common fabrication process, each of emitters 201-1 through 201-N are substantially identical. Emitters 201-1 through 201-N possess the same quantum well characteristics (e.g., quantum well composition and width). Therefore, each of emitters 201-1 through 201-N possesses the same bandwidth ($\Delta\lambda_{QW}$) and each of emitters 201-1 through 201-N possesses the same center wavelength ($\lambda_{C1}$).

After the emitter array with identical emitters has been initially grown, a portion of the emitters are removed utilizing suitable etching techniques. A protective layer may be deposited on selected emitters (e.g., emitters 201-1 through 201-N/2) of the emitter array. Then, a suitable etching solution may be applied. The etching solution may remove the emitters (e.g., emitters 201-N/2+1 through 201-N) that did not receive deposition of the protective layer. FIG. 2 depicts substrate 200 after removal of selected emitters (emitters 201-N/2+1 through 201-N).

Figure 3:
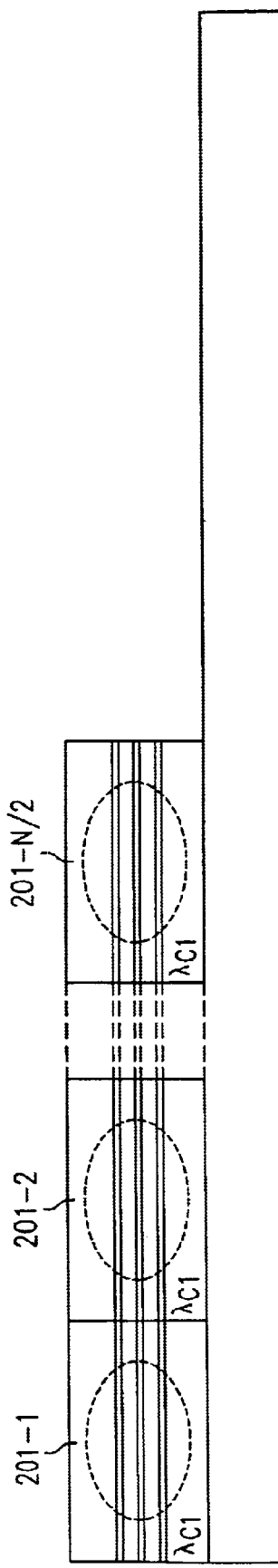
FIG. 3 depicts removal of selected emitters from the emitter array fabricated in FIG. 2 according to embodiments of the present invention.
Figure 4:
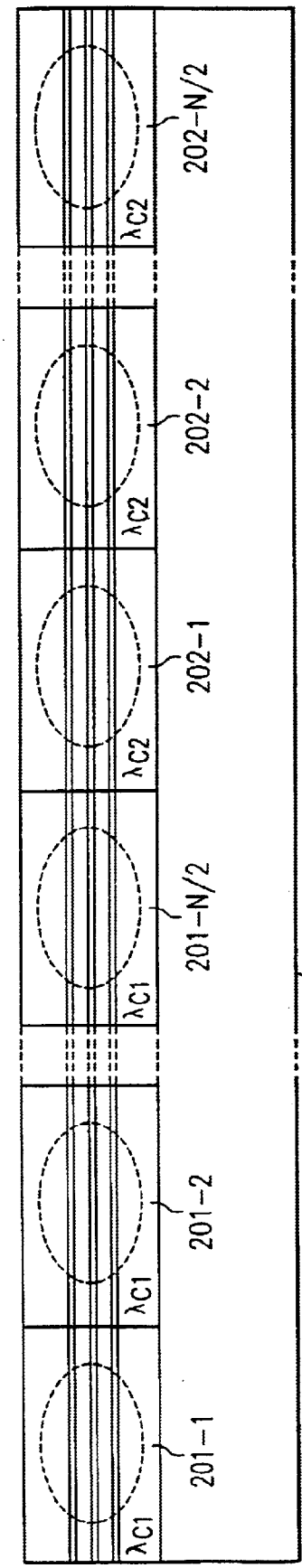
FIG. 4 depicts regrowth of emitters possessing different quantum well characteristics on a portion of substrate where emitters were previously removed according to embodiments of the present invention.

After removal of selected emitters, additional emitters (e.g., emitters 202-1 through 202-N/2) may be grown in placed of the removed emitters (emitters 201-N/2+1 through 201-N). FIG. 3 depicts substrate 200 after regrowth of the additional emitters (emitters 202-1 through 202-N/2). The additional emitters may be fabricated to possess different quantum well characteristics (e.g., quantum well composition and width). In preferred embodiments, the regrown emitters may possess a possesses a center wavelength ($\lambda_{C2}$) that is different than the center wavelength of the first set of emitters. The regrown emitters may possess the same bandwidth ($\Delta\lambda_{QW}$) as the first set of emitters, although the bandwidth may be varied if desired.

Emitters 201-1 through 201-N/2 and emitters 202-1 through 202-N/2 on substrate 200 form emitter array 400. All of the emitters are mechanically coupled, since they have been grown on the same substrate (i.e., substrate 200). Additionally, the emitters are positioned relative to each other in fixed positions due to the fabrication process. Accordingly, emitter array 400 is suitable to be utilized in an IBC laser, since the feedback provided to each emitter of emitter array 400 may be determined by the respective fixed positions of the emitters.

Assuming that both sets of emitters possess the same bandwidth ($\Delta\lambda_{QW}$) and that $\lambda_{C2} > \lambda_{C1}$, the intrinsic bandwidth of emitter array 400 equals $\lambda_{C2} - \lambda_{C1} + \Delta\lambda_{QW}$. Accordingly, emitter array 400 may be incorporated into an IBC laser (e.g., in IBC laser 10 in lieu of emitters 12-1 through 12-N) that is used to generate Raman gain over a substantially greater bandwidth than previously obtained by known single cavity IBC laser technology.

It shall be appreciated that the present invention is not limited to any particular number of emitter sets in an emitter array. Embodiments of the present invention may grow, etch, and regrow any suitable number of emitter sets in an emitter array depending upon their intended use in a suitable application. By etching and regrowing successive layers, embodiments of the present invention enable fabrication of a suitable emitter array that be may used as a Raman pump in an IBC laser to generate Raman gain across any suitable spectrum including the S, C, L, and XL telecommunication bands.

Figure 5:
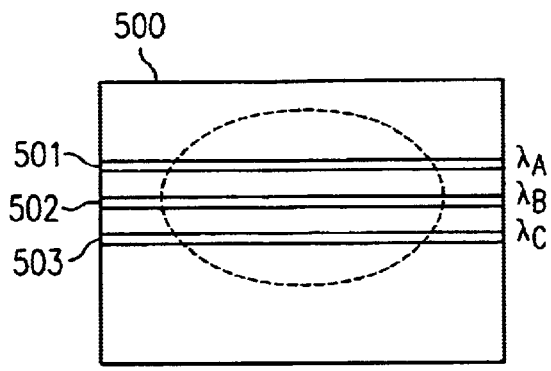
FIG. 5 depicts a known emitter design that may be utilized in an emitter array fabricated according to embodiments of the present invention.

In alternative embodiments of the present invention, the bandwidth of emitter array 400 may be further augmented by utilizing various known emitter designs. One such embodiment is depicted in FIG. 5 in which emitter 500 comprises three quantum wells. Emitters possessing multiple quantum wells may be fabricating utilizing a number of techniques. One such technique is described in U.S. patent application Ser. No. 5,048,040. Each emitter of emitter array 400 may be implemented according to this design. The first well 501 has a composition and thickness to produce a center wavelength of $\lambda_A$. The second well 502 has a composition and thickness to produce a center wavelength of $\lambda_B$. The third well 503 has a composition and thickness to produce a center wavelength of $\lambda_C$. Note that the number of wells is by way of example only, as more or fewer wells could be used. This embodiment is less difficult to fabricate than the other emitter designs. Since each quantum well layer is uniform across the device, the structure of this embodiment may be grown as a uniform wafer. However, this design is not as efficient as other designs. Each emitter lases at a distinct wavelength and hence cannot extract gain from all the quantum wells at their center wavelength. Therefore, while each emitter may extract power from one or more quantum wells, it may not extract power efficiently from all of the quantum wells. This will be the case when the bandwidth of a quantum well is much smaller than the bandwidth of the laser array, and there is a large separation between the peaks of the quantum wells. Thus, the quantum wells within each emitter are not being used efficiently.

Figure 6:
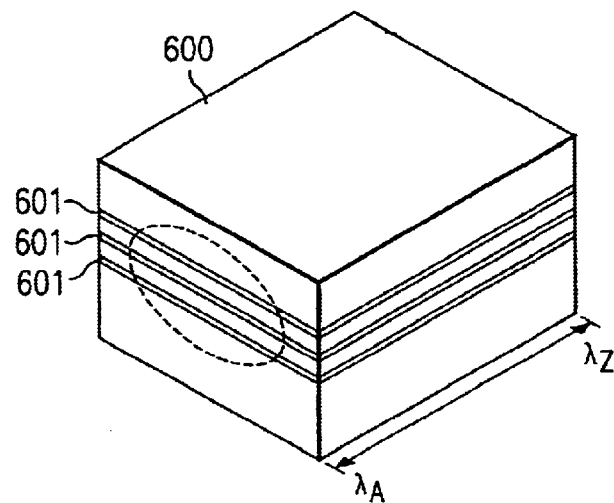
FIG. 6 depicts another known emitter design that may be utilized in an emitter array fabricated according to embodiments of the present invention.

Alternatively, the center wavelengths of the quantum wells of each emitter of emitter array 400 may vary uniformly in a direction that is parallel with the emerging light, e.g., from front to back, as is known in the art. Accordingly, each quantum well has a range of center wavelengths. This embodiment is depicted in FIG. 6. Emitter 600 comprises three quantum wells (601, 602, and 603) which are preferably substantially the same. The composition and/or thickness is varied across the well, from front to back, so that different portions of the well have different center wavelengths, namely $\lambda_A$ to $\lambda_Z$. Note that $\lambda_A$ to $\lambda_Z$ may be different than to $\lambda_1$ to $\lambda_N$, e.g., $\lambda_A$ to $\lambda_Z$ may be larger than or equal to $\lambda_1$ to $\lambda_N$. Further note that $\lambda_A$ to $\lambda_Z$ may be smaller than $\lambda_1$ to $\lambda_N$, particularly if $\lambda_A-\lambda_Z+\Delta\lambda_{QW}$ equals $\lambda_1$ to $\lambda_N$. Thus, at some point in the well, the center wavelength of the well will match lasing wavelength of the emitter. However, this embodiment is more difficult to construct. In order to vary the material and/or thickness of the well across the emitter, the well may be formed by the selective area growth technique as described in "InP Materials and Devices," by O. Wada et al, which is incorporated herein by reference, in its entirety.

Although the techniques for fabricating devices having multiple quantum wells with different center wavelengths or devices having varying quantum well thickness are known in the art, it is not known in the art to incorporate such devices in IBC laser technology. Accordingly, embodiments of the present invention enable the use of existing emitter designs to further modify IBC laser technology to facilitate the use of IBC lasers in applications ( e.g., broadband Raman amplifiers) that were previously considered inappropriate for such technology.

Figure 7:
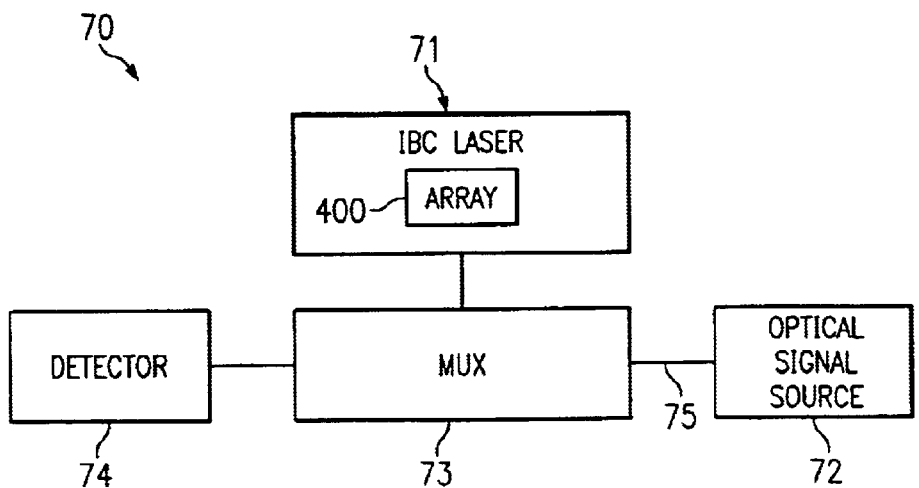
FIG. 7 depicts a system that includes a Raman amplifier according to embodiments of the present invention.

FIG. 7 depicts an arrangement of optical system 70 which includes a Raman amplifier. Optical system 70 includes optical signal source 72 which generates an optical signal to be detected by detector 74. For example, telecommunication providers utilize wavelengths within the C Band and L Band to provide channels to carry information optically. Additionally, it is anticipated telecommunication providers may also begin to utilize wavelengths in the S Band and the XL Band. Thus, the total band (S, C, L, XL) is 1430 nm to 1660 nm, with a bandwidth of 230 nm, while the CL band is from 1530 nm to 1610 nm with a bandwidth of 80 nm. Accordingly, the optical signal may comprise one or more wavelengths within these bands. Detector 74 is disposed at some appreciable distance from optical signal source 72. IBC laser 71 provides a Raman pump. According to embodiments of the present invention, IBC laser 71 comprises array 400 and, hence, provides a Raman pump over suitable bandwidth to multiplexer 73. Multiplexer 73 causes the Raman pump to enter optical fiber 75 which also carries the optical signal generated by optical signal source 72. Due to SRS, the optical signal experiences Raman gain at the desired wavelength(s) in fiber 75. Because the Raman pump possesses sufficient bandwidth, the Raman gain occurs over the desired bandwidth in fiber 75.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of producing an emitter array, comprising:

forming an initial set of emitters that is associated with a first quantum well characteristic on a semiconductor substrate;

etching away a subset of the initial set of emitters from the semiconductor substrate thereby exposing a portion of said semiconductor substrate; and forming, on the portion of the semiconductor substrate, at least one subsequent set of emitters that is associated with a second quantum well characteristic that is different than said first quantum well characteristic.

2. The method of claim 1 wherein said at least one subsequent set of emitters possesses a center wavelength that is different from a center wavelength of said initial set of emitters.

3. The method of claim 1 wherein said first quantum well characteristic is quantum well thickness of a first value and said second quantum well characteristic is quantum well thickness of a second value.

4. The method of claim 1 wherein at least one of said initial set of emitters and said at least one subsequent set of emitters comprises emitters with quantum wells that possess a thickness that varies as a function of position.

5. The method of claim 1 wherein at least one of said initial set of emitters and said at least one subsequent set of emitters comprises emitters with multiple quantum wells with each of said multiple quantum wells possessing a different center wavelength.

6. The method of claim 1 wherein said first quantum well characteristic is a first material composition and said second quantum well characteristic is a second material composition.

7. The method of claim 1 further comprising:

fabricating an incoherently beam combined (IBC) laser utilizing said emitter array.

8. The method of claim 7 further comprising:

operating said IBC laser as a Raman pump.

9. The method of claim 8 wherein said Raman pump is tuned to stimulate Raman gain over at least one band in a wavelength range selected from the list consisting of: 1430 to 1530 nm; 1530 to 1565 nm; 1570 to 1610 nm; and 1615 to 1660 nm.

10. The method of claim 1 wherein said forming an initial set of emitters comprises:

growing waveguide layers, cladding layers, and a gain region.

11. An emitter array, comprising:

a first plurality of emitters with each emitter of said first plurality of emitters being substantially identical and possessing a first quantum well characteristic;

a second plurality of emitters with each emitter of said second plurality of emitters being substantially identical and possessing a second quantum well characteristic that is different that said first quantum well characteristic; and a monolithic substrate, wherein said first plurality of emitters and said second plurality of emitters are coupled to said monolithic substrate by being formed on said monolithic substrate.

12. The emitter array of claim 11 wherein said first quantum well characteristic is a quantum well thickness of a first value and said second quantum well characteristic is a quantum well thickness of a second value.

13. The emitter array of claim 11 wherein said first quantum well characteristic is a first material composition and said second quantum well characteristic is a second material composition.

14. The emitter array of claim 11 wherein said first plurality of emitters possesses a center wavelength that is different from a center wavelength of said second plurality of emitters.

15. The emitter array of claim 11 wherein at least one of said first plurality of emitters and said second plurality of emitters comprises emitters with quantum wells that possess a thickness that varies as a function of position.

16. The emitter array of claim 11 wherein at least one of said first plurality of emitters and said second plurality of emitters comprises emitters that include multiple quantum wells with each of said multiple quantum wells having a different center wavelength.

17. The emitter array of claim 11 wherein said emitter array possesses an intrinsic gain bandwidth of at least 40 nm.

18. A system for providing a Raman pump, comprising:
    an emitter array including:
        a first plurality of emitters with each emitter of said first plurality of emitters being substantially identical and possessing a first quantum well characteristic;
        a second plurality of emitters with each emitter of said second plurality of emitters being substantially identical and possessing a second quantum well characteristic that is different that said first quantum well characteristic; and
        a monolithic substrate, wherein said first plurality of emitters and said second plurality of emitters are coupled to said monolithic substrate by being formed on said monolithic substrate;
    a partially reflective component that provides feedback to said emitter array; and
    a diffraction grating that is operable to diffract output beams from said emitter array toward said partially reflective component and is operable to angularly separate feedback from said partially reflective component.

19. The system of claim 18 wherein said first plurality of emitters possesses a center wavelength that is different from a center wavelength of said second plurality of emitters.

20. The system of claim 18 wherein said first quantum well characteristic is quantum well thickness of a first value and said second quantum well characteristic is quantum well thickness of a second value.

21. The system of claim 18 wherein at least one of first plurality of emitters and said second plurality of emitters comprises emitters with quantum wells that possess a thickness that varies as a function of position.

22. The system of claim 18 wherein at least one of first plurality of emitters and said second plurality of emitters comprises emitters with multiple quantum wells with each of said multiple quantum wells having a different center wavelength.

23. The system of claim 18 wherein said first quantum well characteristic is a first material composition and said second quantum well characteristic is a second material composition.

24. The system of claim 18 further comprising:
    an optical fiber that is operable to receive incoherently combined beams from said first plurality of emitters and said second plurality of emitters.

25. The system of claim 24 wherein said incoherently combined beams from said first plurality of emitters and said second plurality of emitters stimulates Raman scattering of telecommunication signals in said optical fiber.

26. The system of claim 25 wherein Raman gain is stimulated in said optical fiber over a wavelength range selected from the list consisting of: 1430 to 1530 nm; 1530 to 1565 nm; 1570 to 1610 nm; and 1615 to 1660 nm.

27. The system of claim 25 wherein Raman gain is stimulated in said optical fiber over a bandwidth of at least 40 nm.

* * * * *